(12) United States Patent
Gui et al.

(10) Patent No.: US 7,468,291 B2
(45) Date of Patent: Dec. 23, 2008

(54) METHOD AND APPARATUS FOR LOCATING AND/OR FORMING BUMPS

(75) Inventors: Cheng-Qun Gui, Best (NL); David Christopher Ockwell, Waalre (NL); Gabriel Nicolaas Martinus Maria Van Der Voort, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 261 days.

(21) Appl. No.: 11/431,107

(22) Filed: May 10, 2006

(65) Prior Publication Data

US 2007/0265792 A1 Nov. 15, 2007

(51) Int. Cl.
*H01L 21/44* (2006.01)
*H01L 21/48* (2006.01)
*H01L 21/50* (2006.01)

(52) U.S. Cl. .................... 438/108; 438/107; 257/777
(58) Field of Classification Search ................ 257/777, 257/778, 779, 781, 784, 780; 438/107, 108, 438/110
See application file for complete search history.

(56) References Cited

U.S. PATENT DOCUMENTS 7,166,925 B2 * 1/2007 Akram ................. 257/778
2007/0070311 A1 * 3/2007 Bijnen et al. ................. 355/53

* cited by examiner

*Primary Examiner*—Phuc T Dang
(74) *Attorney, Agent, or Firm*—Pillsbury Winthrop Shaw Pittman, LLP

(57) ABSTRACT

A method for locating, forming, or both locating and forming, bumps of material on a substrate having a plurality of devices, the method includes receiving data which indicates the number and location of the devices on the substrate, then using a flip-chip bumping apparatus to locate, form, or both locate and form, bumps of material on the devices, the positions of the devices being determined using the data.

18 Claims, 3 Drawing Sheets

METHOD AND APPARATUS FOR LOCATING AND/OR FORMING BUMPS

FIELD

The present invention relates to a method and apparatus for locating and/or forming bumps.

BACKGROUND

Integrated circuits (IC's) are usually manufactured using lithography. A patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed.

Typically, a multiplicity of layers are provided on a substrate, each layer being processed to permanently fix the pattern in that layer before the next layer is formed. Once all of the layers have been formed and processed, the substrate is cut up into individual IC's and each IC is mounted on a board. Each board is provided with legs which are electrically connected to the IC, thereby allowing electrical signals to pass to and from the IC.

It has been conventional to use wires to connect an IC to a board. However, in recent years the distance between locations to which wires are to be bonded has become progressively smaller, and it has been more difficult to use wire bonding. A process which is known as flip-chip bumping is increasingly used to connect IC's to boards instead of using connection wires. In flip-chip bumping, a small amount of material, such as solder or other metal (e.g., gold), is provided at specific locations on each IC on a substrate. The substrate is inverted and bonded to a board, by heating the material such that it melts and then allowing it to cool again. A problem which arises when using flip-chip bumping is that it may be difficult and/or time consuming to determine the locations of the IC's on the substrate (which is used in order to determine exactly where the small amount of material is to be located on the substrate).

SUMMARY

According to an aspect of the invention, there is provided a method for locating, forming, or both locating and forming, bumps of material on a substrate comprising a plurality of devices, the method comprising receiving data which indicates the number and location of the devices on the substrate, then using a flip-chip bumping apparatus to locate, form, or both locate and form, bumps of material on the devices, the positions of the devices being determined using the data.

According to a further aspect of the invention, there is provided a flip-chip bumping data file comprising the number and location of devices on a substrate.

According to a further aspect of the invention, there is provided a substrate carrier configured to carry a plurality of substrates, wherein the substrate carrier includes a compartment or other feature arranged to receive a data carrier bearing data comprising the number and location of devices on the plurality of substrates.

According to a further aspect of the invention, there is provided a flip-chip bumping apparatus for locating, forming, or both locating and forming, bumps of material on a substrate comprising a plurality of devices, the flip chip bumping apparatus being arranged to receive data which indicates the number and location of the devices on the substrate, then to locate, form, or both locate and form, bumps of material on the devices, the positions of the devices being determined using the data.

According to a further aspect of the invention, there is provided a flip-chip bumping apparatus for locating, forming, or both locating and forming, bumps of material on a substrate comprising a plurality of devices, the flip chip bumping apparatus comprising an imaging detector and pattern recognition software, the apparatus being arranged to scan the imaging detector and the substrate relative to one another, and the pattern recognition software being arranged to determine the locations of devices on the substrate based upon input from the imaging detector.

BREF DESCRIPTION OF THE DRAWINGS

Embodiments of the invention will now be described, by way of example only, with reference to the accompanying schematic drawings in which:

FIG. 1 schematically shows a lithographic apparatus;

DETAILED DESCRIPTION

Figure 1:
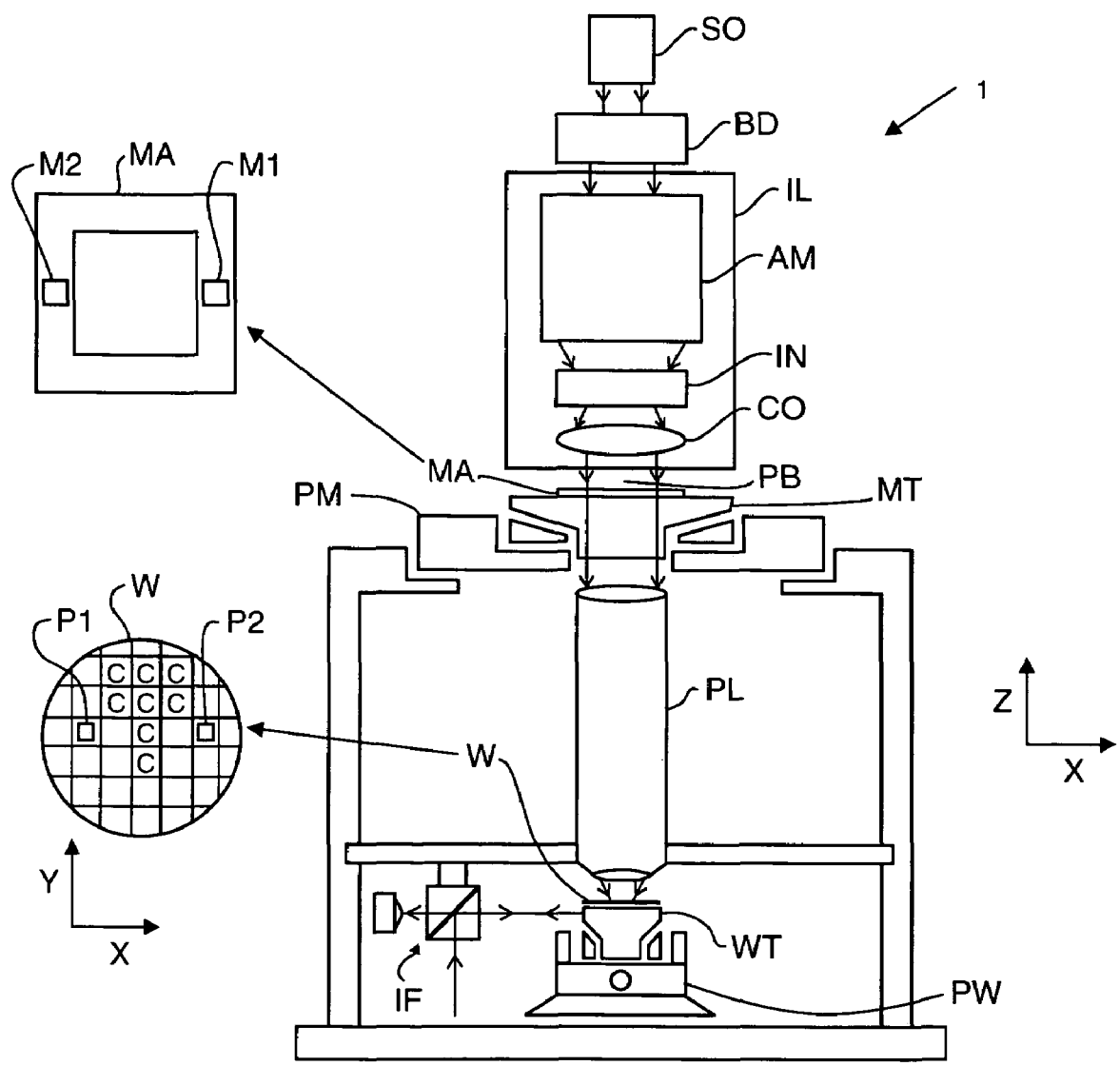

FIG. 1 schematically depicts a lithographic apparatus 1. The apparatus comprises:
- an illumination system (illuminator) IL to condition a beam PB of radiation (e.g. UV radiation or EUV radiation);
- a first support structure (e.g. a mask table) MT to hold a patterning device (e.g. a mask) MA and connected to first positioning means PM to accurately position the patterning device with respect to item PL;
- a substrate table (e.g. a wafer table) WT to hold a substrate (e.g. a resist-coated wafer) W and connected to second positioning means PW to accurately position the substrate with respect to item PL; and
- a projection system (e.g. a refractive projection lens) PL to image a pattern imparted to the beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation having a desired uniformity and intensity distribution in its cross-section.

The conditioned beam PB is incident on the patterning device MA, which is held on the support structure MT. Having traversed the patterning device MA, the beam PB passes through the projection system PL, which focuses the beam onto a target portion C of the substrate W. With the aid of the second positioning means PW and position sensor IF (e.g. an interferometric device), the substrate table WT can be moved accurately, e.g. so as to position different target portions C in the path of the beam PB. Similarly, the first positioning means PM and another position sensor (which is not explicitly depicted in FIG. 1) can be used to accurately position the patterning device MA with respect to the path of the beam PB, e.g. after mechanical retrieval from a mask library, or during a scan. Patterning device MA and substrate W may be aligned using patterning device alignment marks M1, M2 and substrate alignment marks P1, P2.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned.

Following projection of the pattern onto the substrate W, the substrate is processed. This is generally done in a track, a tool that develops the exposed resist (the track may also apply a layer of resist to the substrate before lithographic exposure). The developed resist is then further processed to provide the developed layer with desired electrical properties (for example by filling recesses of the pattern with a suitable semiconductor or metal). A multiplicity of layers are provided in this manner, the layers together forming a plurality of integrated circuits (IC's). The term 'substrate' used herein is intended to include a substrate that already contains multiple processed layers.

Once the IC's have been formed on the substrate, the substrate is passed to a flip-chip bumping apparatus which is used to facilitate bonding (and electrical connection of) the IC's to boards. Typically, the flip-chip bumping apparatus is in a different location from the lithographic apparatus.

Figure 2:
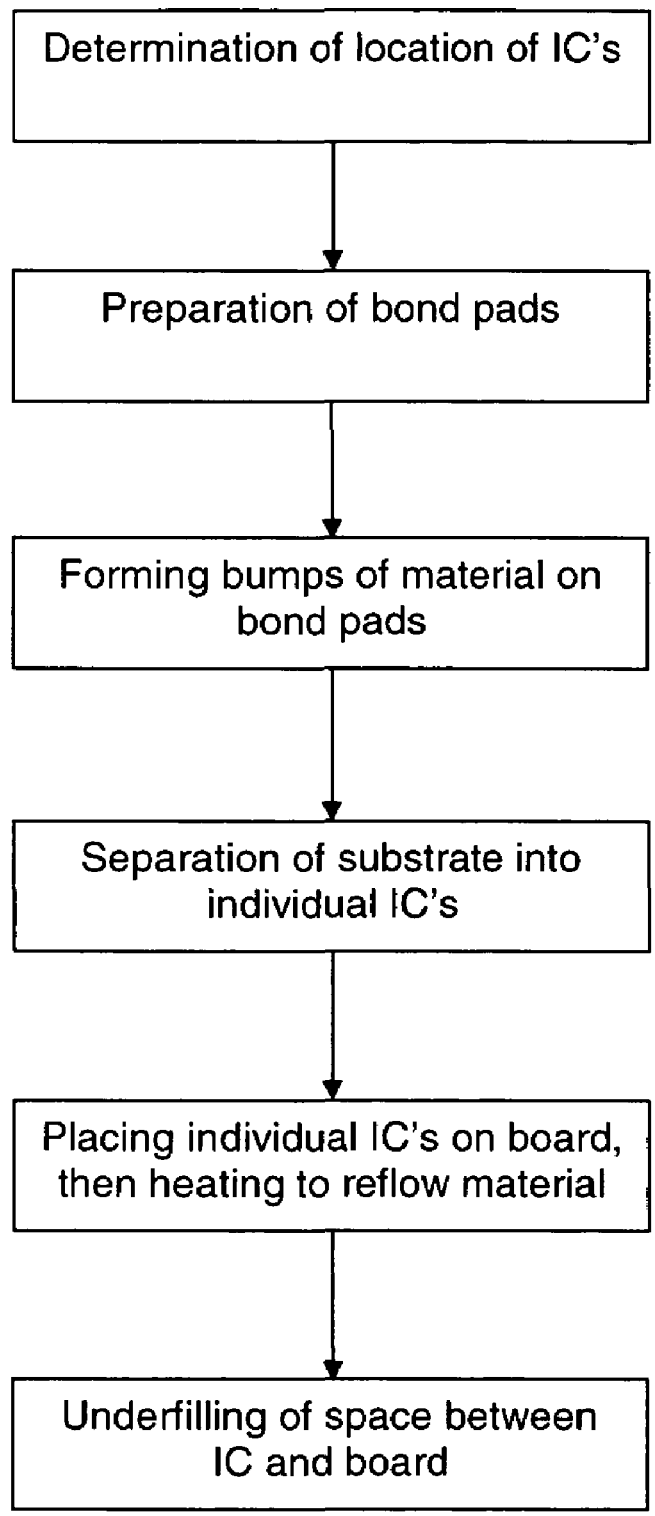
FIG. 2 is a flow diagram of flip-chip bumping process.

A flow chart which summarizes a conventional flip-chip bumping process is shown in FIG. 2. The first step of the flip-chip process is to determine the locations of the IC's on the substrate. The locations of the IC's may be determined manually by an operator using a microscope to measure and record the IC locations. The IC locations may be entered into a flip-chip bumping apparatus to allow accurate placement of bumps on the IC's.

Once the locations of the IC's have been determined, the next step in the flip-chip bumping process is to prepare bond pads of the IC's (a bond pad is an area of metal which is intended to facilitate connection of the IC's to a board). This may include for example cleaning the bond pads, removing any insulating oxides, and providing the bond pads with a layer of metal that will allow a good mechanical and electrical connection to a bump and to the board.

Following this, bumps are formed on the bond pads. The bumps may be formed and/or located, for example, by direct placement, printing, electroplating, evaporation or lithography. If the bumps are located by lithography, a flip-chip bumping apparatus used may be of the type shown schematically in FIG. 1. The flip-chip bumping apparatus is provided a patterning device (e.g., mask) MA having a pattern for the desired bumps and then images this pattern onto a thick layer of resist (i.e. thicker than a layer of resist used in conventional lithography) on the substrate to locate where the bumps will be formed. The resist is then developed and processed such that recesses are formed at the locations where bumps are desired. Material, such as solder, is then electroplated in the recesses in the resist. The resist is then removed, so that bumps project upwards from the uppermost surface of the substrate. The development, processing and electroplating may be performed by the flip-chip bumping apparatus or using separate conventional equipment.

In general, the resolution of the flip-chip bumping apparatus may be low, since the accuracy with which the bumps need to be located is typically around 1 micron (this is a significantly lower accuracy than the accuracy of tens of nanometers that is provided by a high resolution lithographic apparatus). It will be appreciated that this description is not intended to be limited to any specific resolution (or range of resolutions).

In the next step of the process, the substrate is cut up into individual IC's. This is done by cutting along specially provided tracks, known as scribe lanes, provided between the IC's.

A board is brought into contact with the bumps of a given IC, and the board and IC are heated so that the bumps melt and adhere to the board (the bumps continue to adhere to the IC). This provides a mechanical and electrical connection between the IC and the board. The heating may be performed, for example, by using a furnace. This part of the process may also include inverting the substrate such that the bumps are located beneath the substrate (the board being located beneath the bumps).

In the final step of the flip-chip process the space between the IC and the board (i.e. a gap defined by the height of the bumps) is filled with an adhesive or some other suitable material. This is known as underfilling, and provides mechanical strength in addition to protecting the bumps from moisture or other possibly damaging aspects of the surrounding environment.

In an embodiment of the invention, instead of manual determination of the location of the IC's, data which is used during lithographic projection of a layer onto the substrate is used to determine the IC locations.

In an example, when a first IC layer is imaged onto a substrate using a lithographic apparatus, data regarding the IC layer is used by the lithographic apparatus. The data, which is in electronic form, includes the number of IC's and the location of each IC. The data may be expressed in terms of a grid which indicates the separation between IC's in the X and Y directions (these are conventionally used to indicate locations on substrates). The data may also indicate the location of the grid with respect to one or more alignment marks previously provided on the substrate during an earlier lithography step (the alignment marks may, for example, be conventional alignment marks or scribe lane alignment marks). Alternatively or additionally, the data may indicate the location of the grid with respect to a notch provided in the substrate.

The data is retained, and once lithographic projection and processing of all of the IC layers has been completed (i.e. the IC's have been formed), the data is sent with the substrate to the flip-chip bumping apparatus 2.

Instead of the data indicating the location of the grid with respect to one or more alignment marks or a substrate notch, the data may indicate the location of the grid with respect to one or more features of a plurality of IC's on the substrate. Where this is done, the data may, for example, be generated and/or used when projecting a final layer onto the substrate (or a preceding layer if that layer remains visible after the final layer has been formed). Similarly, the data may indicate the location of the grid with respect to one or more alignment marks which are formed when projecting the final layer onto the substrate (or a preceding layer if that layer remains visible after the final layer has been formed).

The data provides the flip-chip bumping apparatus with the grid of the substrate, which indicates the number and location of each IC (this also allows the size of the IC's to be determined). The location of the grid with respect to an alignment mark, a notch, or an IC feature of the substrate is also indicated by the data. The flip-chip bumping apparatus measures the location(s) of the alignment mark(s), notch or IC feature (s) of the substrate, and then applies the grid to the substrate. This allows the determination of the locations of the IC's with respect to the alignment mark(s), notch or IC feature(s). Flip-chip bumping may then proceed, for example via lithographic projection of a pattern (which comprises desired bump locations) from a patterning device MA onto a layer of resist on the substrate. The data is used to determine the positions to which the substrate is to be moved for each projection of the patterning device pattern onto the substrate, i.e. to align the patterning device with the IC's. The locations at which the bumps will be formed on each IC is determined by the pattern provided on the patterning device. This pattern will correspond with the locations of the bond pads (the layout of the bond pads will have been used to determine the pattern on the patterning device).

The resist is developed and processed such that recesses are formed at the locations where bumps are required. Material, such as solder, is then electroplated in the recesses in the resist. The resist is then removed such that the bumps project upwards from the uppermost surface of the substrate.

The flip-chip bumping process may also include some preparation of the bond pads of the IC's. This may include, for example, cleaning the bond pads, removing any insulating oxides, and providing the bond pads with a layer of metal that will allow a good mechanical and electrical connection to a bump and to the board. This may, for example, be achieved via lithography, using an apparatus of the type described further above.

The significance of the data that is input into the flip-chip bumping apparatus is that it indicates the locations onto which the pattern is to be projected. Using the data to determine these locations is quicker and easier than visually inspecting the substrate.

In some instances, a given IC may be formed at a location which is slightly displaced from its intended location (the location recorded in the data). However, any such displacement should be sufficiently small compared to the required accuracy of bump location (typically one micron) so that any such displacement should not cause the bump to be significantly misaligned. The bumps should therefore continue to provide an electrical connection between the IC and the board.

Typically, the substrate will be one of a batch of, for example, 25 substrates which underwent lithography under the same conditions. Each of the substrates of that batch may therefore be expected to have IC's in the same locations. Thus, once the locations of the IC's has been determined for a particular substrate, the IC locations are assumed to be the same for each of the other substrates of the batch. However, each substrate may have its own IC locations data.

Figure 3:
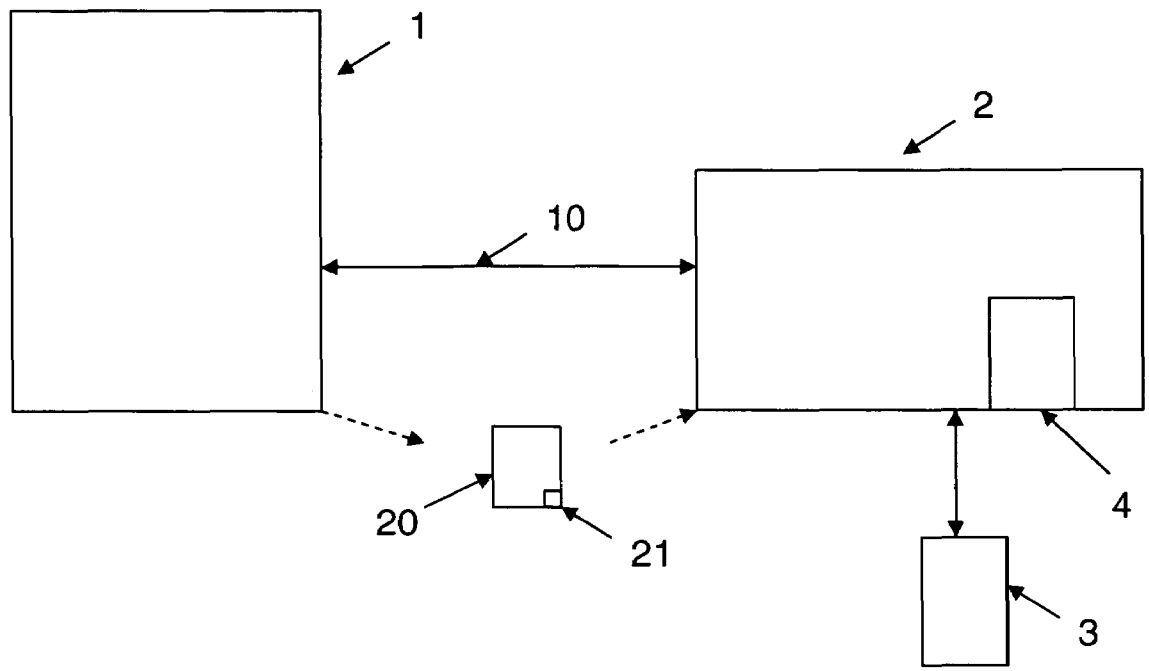
FIG. 3 is a schematic diagram of a flip-chip bumping apparatus according to an embodiment of the invention.
Figure 4:
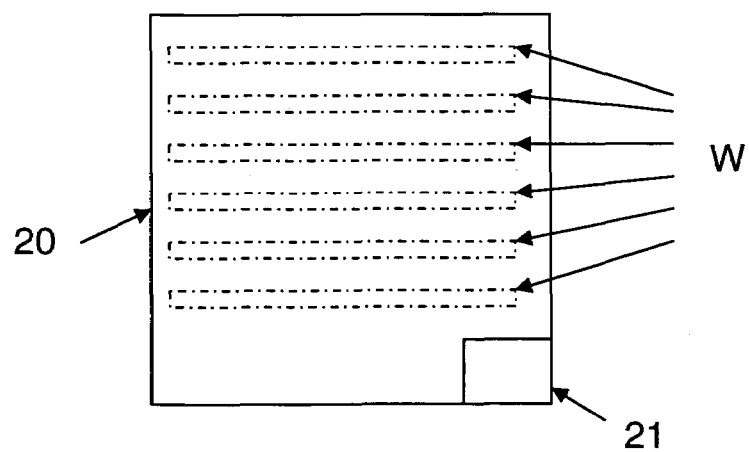
FIG. 4 is a schematic diagram of a substrate carrier according to an embodiment of the invention.

Transfer of the data from the lithographic apparatus 1 may, for example, be achieved by storing the data on a disk, or other data carrier, which is then kept with a batch of substrates to which that data applies. Referring to FIGS. 3 and 4, the data carrier 21 may for example be stored in a dedicated compartment or other feature which forms part of a substrate carrier 20 used to carry the batch of substrates. The data carrier may be read by or transmit data to the flip-chip bumping apparatus 2 (or an associated control computer) when flip-chip bumping of the batch of substrates is to begin.

Alternatively or additionally, the data may be given a file number which is associated with a number that identifies the batch of substrates, and may then be communicated to the flip-chip bumping apparatus separately from the batch of substrates. Referring to FIG. 4, this separate communication could, for example, be via email or other electronic link 10. The data is then stored at the flip-chip bumping apparatus until the flip-chip bumping apparatus receives a batch of substrates to which the data applies. The identification number of the batch of substrates may be input into the flip-chip bumping apparatus (or an associated control computer) by an operator, who may read the identification number from a carrier 20 which carries the batch of substrates, from the substrates themselves if they are labeled, or from accompanying documentation. Alternatively, an automated reader may be used to read and input the batch identification number.

Instead of being provided only for one batch of substrates, the data may be provided for a plurality of batches of substrates. This may be done for example if the positions of the IC's do not vary significantly from batch to batch. The batches of substrates may each be given the same identification number, or a series of identification numbers, which are used to determine which data should be used to determine the locations of the IC's.

The data may include additional information, such as the location(s) of alignment mark(s) (or IC feature(s) used for alignment) with respect to a notch provided in the substrate. This information may be used by the flip-chip bumping apparatus to find the alignment mark(s) (or IC feature(s) used for alignment) so that its position(s) can be measured. This avoids the need for the flip-chip bumping apparatus to scan large areas of the surface of the substrate in order to find the alignment mark(s) (or IC feature(s) used for alignment).

The data may be collected, for example, via metrology measurements, which may be performed by the lithographic apparatus (for example by an alignment system) or by a metrology apparatus 3 which is used to monitor the performance of a lithographic apparatus.

The data may include information regarding processing which has been performed on the substrates, or data relating to the alignment corrections that may have been applied for particular layers during lithography.

The data may include more information, for example the locations of defective IC's, or the identities of defective substrates. The locations of defective IC's may, for example, be recorded in relation to individual substrates. This information may be used by the flip-chip bumping apparatus to skip over defective IC's and not locate and/or form bumps on those IC's.

The data may include information relating to the surface topography of substrates (for example a map of the height of each substrate).

Where information relating to particular substrates is used, individual substrates may be given identification numbers, to allow them to be identified by the flip-chip bumping apparatus. Alternatively, the order of each substrate within a batch of substrates may be fixed, so that the flip-chip bumping apparatus can determine the identity of a given substrate by counting the number of substrates of the batch that have already been processed.

In the above description, the flip-chip bumping process has been described in terms of the use of solder. The term 'solder' is intended to include any suitable metal or alloy, and includes (but is not limited to) Eutectic 63Sn/37Pb solder, high lead solder, 95Pb5Sn, Tin, SnCuAg, SnAg3.5 and SnCu. Other suitable materials may be used, and such materials will be known to those skilled in the art. The data could include an indication of which material is to be used for a given batch of substrates.

The data could include the size of the substrate, although in practice this should be immediately apparent or easily measurable.

Although the described embodiment of the invention refers to using lithography to locate the bumps, it will be appreciated that other techniques may be used to locate and/or provide the bumps. Where other techniques are used, for example direct placement, printing, electroplating or evaporation, the data may be used in the same manner (i.e. to determine the locations of the IC's, and thereby allow the bumps to be correctly located).

In an alternative or additional embodiment of the invention, the flip-chip bumping apparatus may be provided with an imaging detector 4 and pattern recognition software to allow the locations of IC's to be determined. Where this is done, the imaging detector is arranged to scan over the surface of the substrate (this may be done by moving the detector, the substrate or both). Since, in general, each IC will have the same appearance, this property can be used by the pattern recognition software to determine the locations of the IC's (and their number and size). Bumps of material may then be provided in the manner described further above. In an embodiment, the imaging detector and pattern recognition software may be provided separately from the flip-chip bumping apparatus, such as tool 3, and wired or wirelessly connected to the flip-chip bumping apparatus 2.

Although specific reference may be made in this text to the use of flip-chip bumping for IC's, it should be understood that the invention described herein may have other applications, such as flip-chip bumping for integrated optical systems, guidance and detection patterns for magnetic domain memories, liquid-crystal displays (LCDs), thin-film magnetic heads, etc. In general where the above description refers to an IC (or IC's), it will be understood that this is intended to include a device (or devices), which may or may not be an IC.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

While specific embodiments of the invention have been described above, it will be appreciated that the invention may be practiced otherwise than as described. The description is not intended to limit the invention.

The invention claimed is:

1. A method for locating, forming, or both locating and forming, bumps of material on a substrate comprising a plurality of devices, the method comprising receiving data which indicates the number and location of the devices on the substrate, then using a flip-chip bumping apparatus to locate, form, or both locate and form, bumps of material on the devices, positions of the devices being determined using the data, wherein the data comprises data which has been used during lithographic manufacture of the devices on the substrate, or on a different substrate having the same number and location of devices.

2. The method of claim 1 further comprising transferring the data from the location at which lithographic manufacture of the devices was performed to the flip-chip bumping apparatus, the data being transferred using a data carrier or electronic data transfer.

3. The method of claim 2, wherein the data is associated with a plurality of substrates.

4. The method of claim 3, wherein the plurality of substrates is transported from the location at which lithographic manufacture of the devices was performed to the flip chip bumping apparatus using a substrate carrier, and the substrate carrier is arranged such that the data carrier may be stored therewith.

5. The method of claim 3, wherein the plurality of substrates includes an identifier which corresponds to an identifier included in the data, the data being transferred electronically to the flip-chip bumping apparatus, and stored at the flip-chip bumping apparatus until the flip-chip bumping apparatus receives the plurality of substrates, whereupon the data is used for the plurality of substrates.

6. The method of claim 1, wherein the data further includes at least one of the data selected from the following:
   a location of an alignment mark on the substrate;
   a location of a defective device, or an identity of a defective substrate;
   a location of an alignment mark projected onto the substrate with a particular layer;
   processing which has been performed on the substrate;
   an alignment correction that may have been applied for a particular layer during lithography;
   a relationship between locations of the devices and a location of an alignment mark, a notch, or a device feature present on the substrate;
   a relationship between a location of an alignment mark and a notch present on the substrate;
   information relating to the surface topography of the substrate.

7. The method of claim 1, wherein the bumps of material are located, formed, or both located and formed, on the substrate using direct placement, printing, electroplating, evaporation or lithography.

8. The method of claim 1, further comprising preparation of bond pads of the devices prior to locating, forming, or both locating and forming, the bumps of material on the substrate.

9. The method of claim 1, wherein the material comprises a solder comprising Eutectic 63Sn.37Pb solder, high lead solder, 95Pb5Sn, Tin, SnCuAg, SnAg3.5 or SnCu.

10. A data storage medium having a computer program stored therein, the computer program containing one or more sequences of machine-readable instructions to cause performance of a method for locating, forming, or both locating and forming, bumps of material on a substrate comprising a plurality of devices, the method comprising receiving data which indicates the number and location of the devices on the substrate, then causing a flip-chip bumping apparatus to locate, form, or both locate and form, bumps of material on the devices, the positions of the devices being determined using the data, wherein the data comprises data which has been used during lithographic manufacture of the devices on the substrate, or on a different substrate having the same number and location of devices.

11. The data storage medium of claim 10, wherein the method further comprises transferring the data from the location at which lithographic manufacture of the devices was performed to the flip-chip bumping apparatus, the data being transferred using a data carrier or electronic data transfer.

12. The data storage medium of claim 10, wherein the data is associated with a plurality of substrates.

13. The data storage medium of claim 12, wherein the plurality of substrates includes an identifier which corresponds to an identifier included in the data, the data being transferred electronically to the flip-chip bumping apparatus, and stored at the flip-chip bumping apparatus until the flip-chip bumping apparatus receives the plurality of substrates, whereupon the data is used for the plurality of substrates.

14. The data storage medium of claim 10, wherein the data further includes at least one of the data selected from the following:
   a location of an alignment mark on the substrate;
   a location of a defective device, or an identity of a defective substrate;
   a location of an alignment mark projected onto the substrate with a particular layer;
   processing which has been performed on the substrate;
   an alignment correction that may have been applied for a particular layer during lithography;
   a relationship between locations of the devices and a location of an alignment mark, a notch, or a device feature present on the substrate;
   a relationship between a location of an alignment mark and a notch present on the substrate; information relating to the surface topography of the substrate.

15. A method for locating, forming, or both locating and forming, bumps of material on a substrate comprising a plurality of devices, the method comprising receiving data which indicates the number and location of the devices on the substrate, then using a flip-chip bumping apparatus to locate, form, or both locate and form, bumps of material on the devices, positions of the devices being determined using the data, wherein the data further includes at least one of the data selected from the following:
   a location of an alignment mark on the substrate;
   a location of a defective device, or an identity of a defective substrate;
   a location of an alignment mark projected onto the substrate with a particular layer;
   processing which has been performed on the substrate;
   an alignment correction that may have been applied for a particular layer during lithography;
   a relationship between locations of the devices and a location of an alignment mark, a notch, or a device feature present on the substrate; or
   a relationship between a location of an alignment mark and a notch present on the substrate.

16. The method of claim 15, wherein the data includes at least one of the data selected from the following:
   a location of an alignment mark on the substrate;
   a location of an alignment mark projected onto the substrate with a particular layer;
   an alignment correction that may have been applied for a particular layer during lithography;
   a relationship between locations of the devices and a location of an alignment mark or a notch present on the substrate; or
   a relationship between a location of an alignment mark and a notch present on the substrate.

17. A data storage medium having a computer program stored therein, the computer program containing one or more sequences of machine-readable instructions to cause performance of a method for locating, forming, or both locating and forming, bumps of material on a substrate comprising a plurality of devices, the method comprising receiving data which indicates the number and location of the devices on the substrate, then causing a flip-chip bumping apparatus to locate, form, or both locate and form, bumps of material on the devices, positions of the devices being determined using the data, wherein the data further includes at least one of the data selected from the following:
   a location of an alignment mark on the substrate;
   a location of a defective device, or an identity of a defective substrate;
   a location of an alignment mark projected onto the substrate with a particular layer;
   processing which has been performed on the substrate;
   an alignment correction that may have been applied for a particular layer during lithography;
   a relationship between locations of the devices and a location of an alignment mark, a notch, or a device feature present on the substrate;
   a relationship between a location of an alignment mark and a notch present on the substrate; or information relating to the surface topography of the substrate.

18. The data storage medium of claim 17, wherein the data includes at least one of the data selected from the following:
   a location of an alignment mark on the substrate;
   a location of an alignment mark projected onto the substrate with a particular layer;
   an alignment correction that may have been applied for a particular layer during lithography;
   a relationship between locations of the devices and a location of an alignment mark or a notch present on the substrate; or
   a relationship between a location of an alignment mark and a notch present on the substrate.

* * * * *